(12) United States Patent
Yun et al.

(10) Patent No.: US 8,553,478 B2
(45) Date of Patent: Oct. 8, 2013

(54) SEMICONDUCTOR INTEGRATED CIRCUIT AND CONTROL METHOD THEREOF

(75) Inventors: Tae Sik Yun, Ichon-shi (KR); Kang Seol Lee, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 208 days.

(21) Appl. No.: 13/190,169

(22) Filed: Jul. 25, 2011

(65) Prior Publication Data

US 2012/0195137 A1    Aug. 2, 2012

(30) Foreign Application Priority Data

Jan. 28, 2011   (KR) ........................ 10-2011-0009076

(51) Int. Cl.
*G11C 7/00* (2006.01)
(52) U.S. Cl.
USPC ............. 365/189.2; 365/189.011; 365/189.07
(58) Field of Classification Search
USPC ........................................ 365/189.011–225.7
See application file for complete search history.

(56) References Cited

U.S. PATENT DOCUMENTS

| 7,142,471 | B2 * | 11/2006 | Fasoli et al. .................... 365/200 |
| 7,940,074 | B2 | 5/2011 | Ku |
| 2002/0027798 | A1 * | 3/2002 | Takashima ..................... 365/145 |
| 2002/0048191 | A1 * | 4/2002 | Ikehashi et al. ........... 365/185.22 |
| 2003/0058701 | A1 * | 3/2003 | Takashima ..................... 365/200 |
| 2004/0042331 | A1 * | 3/2004 | Ikehashi et al. ................ 365/232 |
| 2004/0090812 | A1 * | 5/2004 | Takashima ..................... 365/145 |
| 2005/0007857 | A1 * | 1/2005 | Hiraki et al. ................... 365/226 |
| 2005/0063225 | A1 * | 3/2005 | Takashima ..................... 365/199 |
| 2006/0221728 | A1 * | 10/2006 | Fasoli et al. .................... 365/200 |
| 2006/0221752 | A1 * | 10/2006 | Fasoli et al. ............. 365/230.03 |
| 2008/0192524 | A1 * | 8/2008 | Fasoli et al. ...................... 365/51 |

FOREIGN PATENT DOCUMENTS

KR    1020110105256 A    9/2011

* cited by examiner

*Primary Examiner* — Harry W Byrne
(74) *Attorney, Agent, or Firm* — William Park & Associates Patent Ltd.

(57) ABSTRACT

A semiconductor integrated circuit includes a first chip and a second chip stacked together with the first chip. A first memory area is formed on the second chip, and a second memory area for repairing a failure of the first memory area is formed on the first chip.

4 Claims, 13 Drawing Sheets

FIG.14

Configuration Example of Row Redundant Cells in the case of 8 rank and 8 bank

| | | | |
|---|---|---|---|
| RK0 RACT0 | RK0 RACT1 | RK0 RACT4 | RK0 RACT5 |
| RK1 RACT0 | RK1 RACT1 | RK1 RACT4 | RK1 RACT5 |
| RK2 RACT0 | RK2 RACT1 | RK2 RACT4 | RK2 RACT5 |
| RK3 RACT0 | RK3 RACT1 | RK3 RACT4 | RK3 RACT5 |
| RK4 RACT0 | RK4 RACT1 | RK4 RACT4 | RK4 RACT5 |
| RK5 RACT0 | RK5 RACT1 | RK5 RACT4 | RK5 RACT5 |
| RK6 RACT0 | RK6 RACT1 | RK6 RACT4 | RK6 RACT5 |
| RK7 RACT0 | RK7 RACT1 | RK7 RACT4 | RK7 RACT5 |
| | | | |
| RK7 RACT2 | RK7 RACT3 | RK7 RACT6 | RK7 RACT7 |
| RK6 RACT2 | RK6 RACT3 | RK6 RACT6 | RK6 RACT7 |
| RK5 RACT2 | RK5 RACT3 | RK5 RACT6 | RK5 RACT7 |
| RK4 RACT2 | RK4 RACT3 | RK4 RACT6 | RK4 RACT7 |
| RK3 RACT2 | RK3 RACT3 | RK3 RACT6 | RK3 RACT7 |
| RK2 RACT2 | RK2 RACT3 | RK2 RACT6 | RK2 RACT7 |
| RK1 RACT2 | RK1 RACT3 | RK1 RACT6 | RK1 RACT7 |
| RK0 RACT2 | RK0 RACT3 | RK0 RACT6 | RK0 RACT7 |

FIG.15

Configuration Example of Row Redundant Cells in the case of 4 rank and 8 bank

| | | | |
|---|---|---|---|
| RK0 RACT0 | RK0 RACT1 | RK0 RACT4 | RK0 RACT5 |
| RK0 RACT0 | RK0 RACT1 | RK0 RACT4 | RK0 RACT5 |
| RK1 RACT0 | RK1 RACT1 | RK1 RACT4 | RK1 RACT5 |
| RK1 RACT0 | RK1 RACT1 | RK1 RACT4 | RK1 RACT5 |
| RK2 RACT0 | RK2 RACT1 | RK2 RACT4 | RK2 RACT5 |
| RK2 RACT0 | RK2 RACT1 | RK2 RACT4 | RK2 RACT5 |
| RK3 RACT0 | RK3 RACT1 | RK3 RACT4 | RK3 RACT5 |
| RK3 RACT0 | RK3 RACT1 | RK3 RACT4 | RK3 RACT5 |
| | | | |
| RK3 RACT2 | RK3 RACT3 | RK3 RACT6 | RK3 RACT7 |
| RK3 RACT2 | RK3 RACT3 | RK3 RACT6 | RK3 RACT7 |
| RK2 RACT2 | RK2 RACT3 | RK2 RACT6 | RK2 RACT7 |
| RK2 RACT2 | RK2 RACT3 | RK2 RACT6 | RK2 RACT7 |
| RK1 RACT2 | RK1 RACT3 | RK1 RACT6 | RK1 RACT7 |
| RK1 RACT2 | RK1 RACT3 | RK1 RACT6 | RK1 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |

FIG. 16

Configuration Example of Row Redundant Cells in the case of 2 rank and 8 bank

| | | | |
|---|---|---|---|
| RK0 RACT0 | RK0 RACT1 | RK0 RACT4 | RK0 RACT5 |
| RK0 RACT0 | RK0 RACT1 | RK0 RACT4 | RK0 RACT5 |
| RK0 RACT0 | RK0 RACT1 | RK0 RACT4 | RK0 RACT5 |
| RK0 RACT0 | RK0 RACT1 | RK0 RACT4 | RK0 RACT5 |
| RK1 RACT0 | RK1 RACT1 | RK1 RACT4 | RK1 RACT5 |
| RK1 RACT0 | RK1 RACT1 | RK1 RACT4 | RK1 RACT5 |
| RK1 RACT0 | RK1 RACT1 | RK1 RACT4 | RK1 RACT5 |
| RK1 RACT0 | RK1 RACT1 | RK1 RACT4 | RK1 RACT5 |
| | | | |
| RK1 RACT2 | RK1 RACT3 | RK1 RACT6 | RK1 RACT7 |
| RK1 RACT2 | RK1 RACT3 | RK1 RACT6 | RK1 RACT7 |
| RK1 RACT2 | RK1 RACT3 | RK1 RACT6 | RK1 RACT7 |
| RK1 RACT2 | RK1 RACT3 | RK1 RACT6 | RK1 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |

FIG. 17

Configuration Example of Row Redundant Cells in the case of 1 rank and 8 bank

| | | | |
|---|---|---|---|
| RK0 RACT0 | RK0 RACT1 | RK0 RACT4 | RK0 RACT5 |
| RK0 RACT0 | RK0 RACT1 | RK0 RACT4 | RK0 RACT5 |
| RK0 RACT0 | RK0 RACT1 | RK0 RACT4 | RK0 RACT5 |
| RK0 RACT0 | RK0 RACT1 | RK0 RACT4 | RK0 RACT5 |
| RK0 RACT0 | RK0 RACT1 | RK0 RACT4 | RK0 RACT5 |
| RK0 RACT0 | RK0 RACT1 | RK0 RACT4 | RK0 RACT5 |
| RK0 RACT0 | RK0 RACT1 | RK0 RACT4 | RK0 RACT5 |
| RK0 RACT0 | RK0 RACT1 | RK0 RACT4 | RK0 RACT5 |
| | | | |
| RK0 RACT2 | RK0 RACT3 | RK0 RACT6 | RK0 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |
| RK0 RACT2 | RK0 RACT3 | RK0 RACT6 | RK0 RACT7 |

SEMICONDUCTOR INTEGRATED CIRCUIT AND CONTROL METHOD THEREOF

CROSS-REFERENCE TO RELATED APPLICATION

The present application claims priority to Korean Patent Application No. 10-2011-0009076, filed on Jan. 28, 2011, in the Korean Intellectual Property Office, which is incorporated herein by reference in its entirety as if set forth in full.

BACKGROUND

1. Technical Field

Various embodiments of the present invention relate to a semiconductor integrated circuits and related methods. In particular, certain embodiments relate to a semiconductor integrated circuit and a control method thereof.

2. Related Art

A semiconductor integrated circuit often uses a multi-chip package including two or more chips in order to improve the degree of integration of the semiconductor integrated circuit.

As illustrated in FIG. 1, a typical semiconductor integrated circuit 1 has a stacked structure of a master chip (hereinafter, referred to as a master) and a slave chip (hereinafter, referred to as a slave) by way of one or more through-silicon vias (TSVs).

The master includes a peripheral area, a TSV area A for signal transfer, and a TSV area B for physical support and supply of power. The master has no memory area.

The slave includes a peripheral area, a TSV area A' for signal transfer, a TSV area B' for physical support and supply of power, and memory areas. The memory areas of the slave may, for example, use dynamic random access memories (DRAMs) and may be divided into eight memory banks BK0 to BK7.

Each memory bank of the slave includes redundant cells for a repair operation which substitute for failed normal cells.

Furthermore, a fuse set, a control logic circuit and others related to the repair operation, are positioned between the memory banks, between the memory bank and the peripheral area, between the memory bank and the TSV area, and the like.

As illustrated in FIG. 2, the master includes a circuit for generating a row active signal RACT, wherein the circuit may include a plurality of NAND gates ND1 and ND2, a plurality of transistors M1 and M2, and a plurality of inverters IV1 to IV4.

Row active signals RACT must be provided corresponding to the number of the memory banks. Therefore, a number of the circuits illustrated in FIG. 2 are provided corresponding to the number of the memory banks.

The circuit illustrated in FIG. 2 generates the row active signal RACT in response to an active pulse ACTP, a slice address signal SLICE, a row active signal RACT, and a precharge pulse PREP.

As illustrated in FIG. 3, the slave includes a word line driving circuit 10 for driving word lines, wherein the word line driving circuit 10 includes a plurality of fuse blocks 11, a determination unit 13, a driver block (RMWL DRV) 14, a driver block (BAX DRV) 16, a driver block (FX DRV) 18, a mat selection unit 15, and a decoder 17.

The fuse blocks 11 compare a row address signal RA with repair address signals to generate signals HITB<0:N>.

The repair address signals are stored by selectively cutting fuses of the fuse blocks.

The determination unit 13 combines the row active signal RACT with the signals HITB<0:N> to generate various signals XHITB<0:M>, NXEB, and RAX2<0:1>.

The signals XHITB<0:M> are used to define the activation of redundant main word lines RMWL<0:M>. The signal NXEB is used to prevent the activation of the repair address signals, that is, normal word lines defined by fuse data. The signals RAX2<0:1> are address signals for designating subword lines, and correspond to an example in which main word lines and sub-word lines have been coded at the rate of 1:4.

The mat selection unit 15 generates an enable signal EN for preventing the activation of the normal word line in response to the signals XHITB<0:M> and NXEB, and selecting a sub-word line corresponding to a redundant cell array of a cell mat 20.

The decoder 17 decodes the row address signal RA and generates an address signal LAX.

The driver block 14 drives the redundant main word lines RMWL<0:M> corresponding to the signals XHITB<0:M>.

The driver block 16 drives the address signals RAX2<0:1> to generate an address signal BAX.

The driver block 18 drives the address signal BAX to generate a sub-word line driving signal FX.

As illustrated in FIG. 4, the determination unit 13 includes logic circuits 13-1 to 13-3.

The logic circuit 13-1 combines the output signals HITB<0:N> of the fuse blocks 11 with the row active signal RACT to generate the signals XHITB<0:M>.

FIG. 4 illustrates only a configuration in which the logic circuit 13-1 generates the signal XHITB<0>, and (M+1) logic circuits 13-1 are provided in order to generate the signals XHITB<0:M>.

The logic circuit 13-2 combines signals having even sequences with signals having odd sequences among the output signals HITB<0:N> of the fuse blocks 11 to generate signals HITSUM_EVEN and HITSUM_ODD.

The logic circuit 13-3 combines the signals HITSUM_EVEN, HITSUM_ODD, and RACT to generate the address signals RAX2<0:1> and the signal NXEB.

Since the slave includes the memory area but the master includes no memory area in the typical semiconductor integrated circuit 1, chip sizes of the master and the slave are different from each other.

Therefore, in order to simply connect the master to the slave with each other through the TSV, it is necessary to increase the chip size of the master.

As described above, in a typical semiconductor integrated circuit, the inefficient increase in the chip size of the master results in a reduction in a net die.

Furthermore, a slave of a typical semiconductor integrated circuit has normal cells and redundant cells, and performs a repair operation by itself, that is, an association operation for determining whether to repair a memory cell to be accessed.

Therefore, since an additional time is required to perform an operation for comparing fuse data with an external address signal for the repair operation, asynchronous parameters may increase.

SUMMARY

Accordingly, there is a need for an improved semiconductor integrated circuit and a control method thereof that may obviate one or more of the above-mentioned problems or disadvantages. In particular there is a need for an improved semiconductor integrated circuit and a control method thereof capable of efficiently using areas of stacked chips.

In the following description, certain aspects and embodiments will become evident. It should be understood that these aspects and embodiments are merely exemplary, and the invention, in its broadest sense, could be practiced without having one or more features of these aspects and embodiments.

In one exemplary aspect of the present invention, a semiconductor integrated circuit may comprise: a first chip; and a second chip stacked together with the first chip, wherein a first memory area is formed in the second chip, and a second memory area, for repairing a failure of the first memory area, is formed in the first chip.

In another exemplary aspect of the present invention, a semiconductor integrated circuit may comprise: a slave including a first memory area; and a master including a second memory area configured to determine whether a failure has occurred in the first memory area, and replace a failed memory cell of the first memory area with a memory cell of the second memory area according to a determination result.

In yet another exemplary aspect, the slave may be configured to prevent the activation of a failed memory cell of the first memory area in response to a repair flag signal.

In still another exemplary aspect, the master may be configured to prevent the activation of the first memory area in a refresh operation.

In another exemplary aspect, the first memory area may comprise a memory different from a memory of the second memory area.

In still another exemplary aspect, the second memory area may comprise a static random access memory (SRAM).

In yet another exemplary aspect of the present invention, a semiconductor integrated circuit may comprise: a slave including a first memory area comprising normal cells, and configured to activate a normal cell corresponding to a row address signal among the normal cells; and a master comprising a second memory area comprising redundant cells which substitute for the normal cells, and configured to activate a redundant cell among the redundant cells corresponding to a result of a comparison of the row address signal and repair address signals.

Some exemplary aspects of the present invention may provide a method for controlling a semiconductor integrated circuit having a slave with a first memory area and a master with a second memory area. The method may comprise: the master determining whether or not to repair an external address signal; the master informing the slave of a determination result obtained by determining whether or not to repair the external address signal, and activating a memory cell of the second memory area in response to the determination result; and the slave preventing activation of a memory cell of the first memory area in response to the determination result.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIGS. 14 to 17 are diagrams illustrating examples in which redundant cells of an exemplary embodiment are configured according to rank schemes.

DETAILED DESCRIPTION

Figure 1:
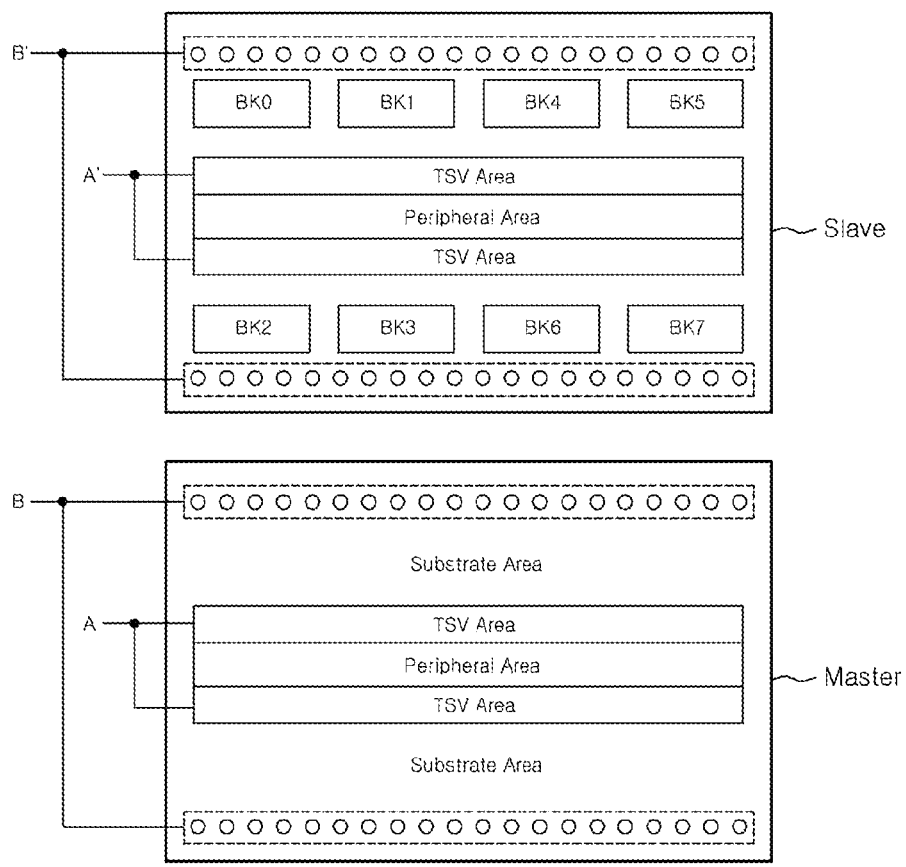
FIG. 1 is a layout diagram of a typical semiconductor integrated circuit.
Figure 2:
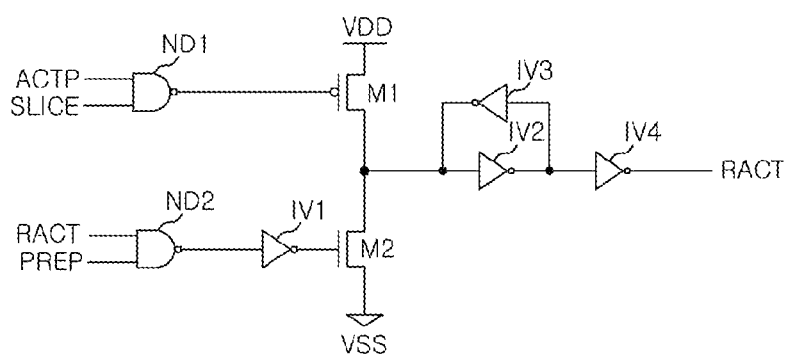
FIG. 2 is a circuit diagram of a row active signal generation circuit of the master illustrated in FIG. 1.
Figure 3:
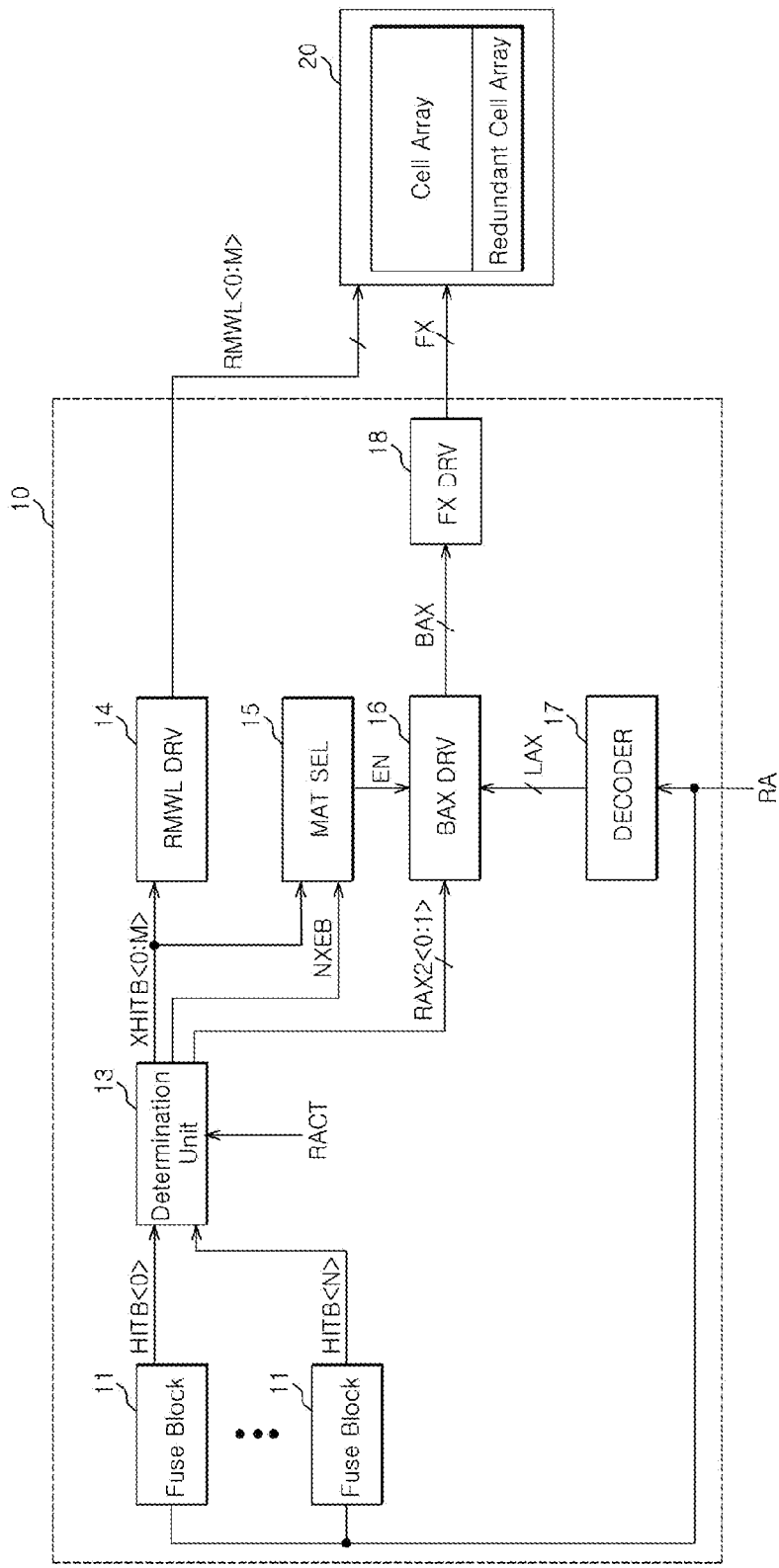
FIG. 3 is a block diagram of a word line driving circuit of the slave illustrated in FIG. 1.
Figure 4:
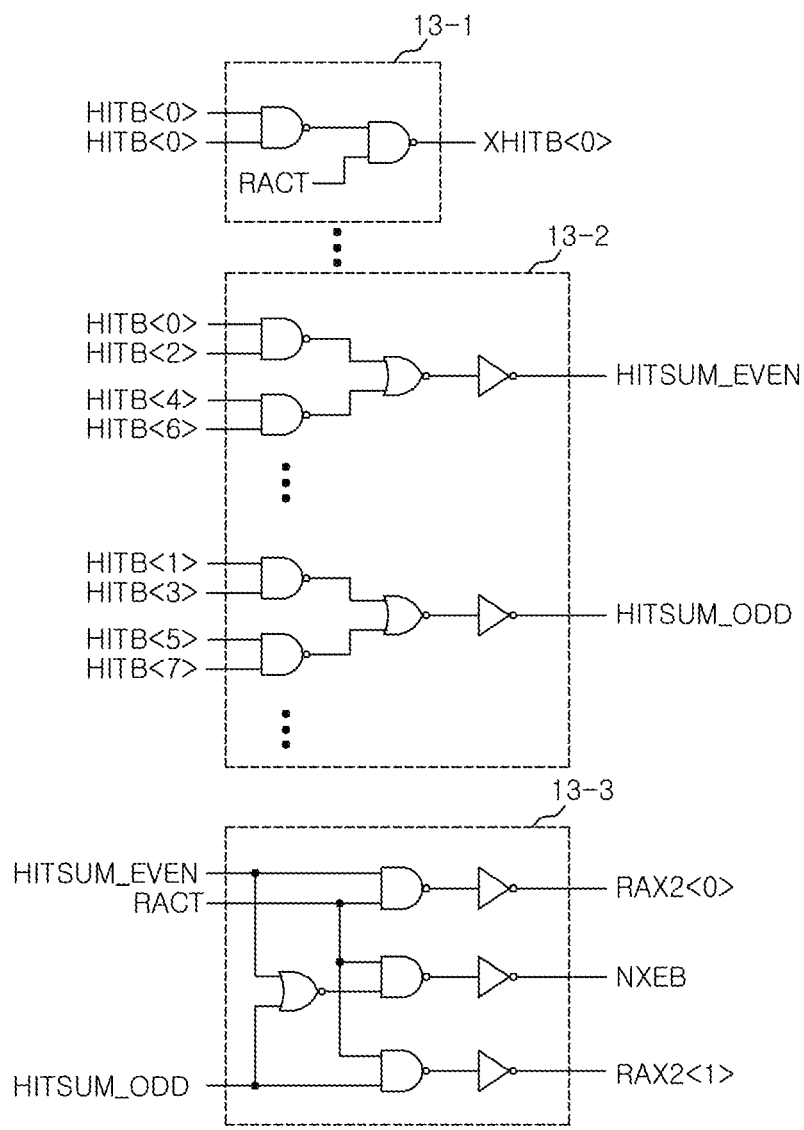
FIG. 4 is a circuit diagram of the determination unit illustrated in FIG. 3.

Reference will now be made in detail to the exemplary embodiments consistent with the present disclosure, examples of which are illustrated in the accompanying drawings. Wherever possible, the same reference characters will be used throughout the drawings to refer to the same or like parts.

Various embodiments provide a semiconductor integrated circuit with a structure in which a master chip (hereinafter, referred to as a master) and one or more slave chips (hereinafter, referred to as a slave) are stacked using a through-silicon via (TSV).

The master is configured to provide the slaves with external signals, power, and the like through the TSV, and perform signal transmission/reception with respect to the slaves.

Figure 5:
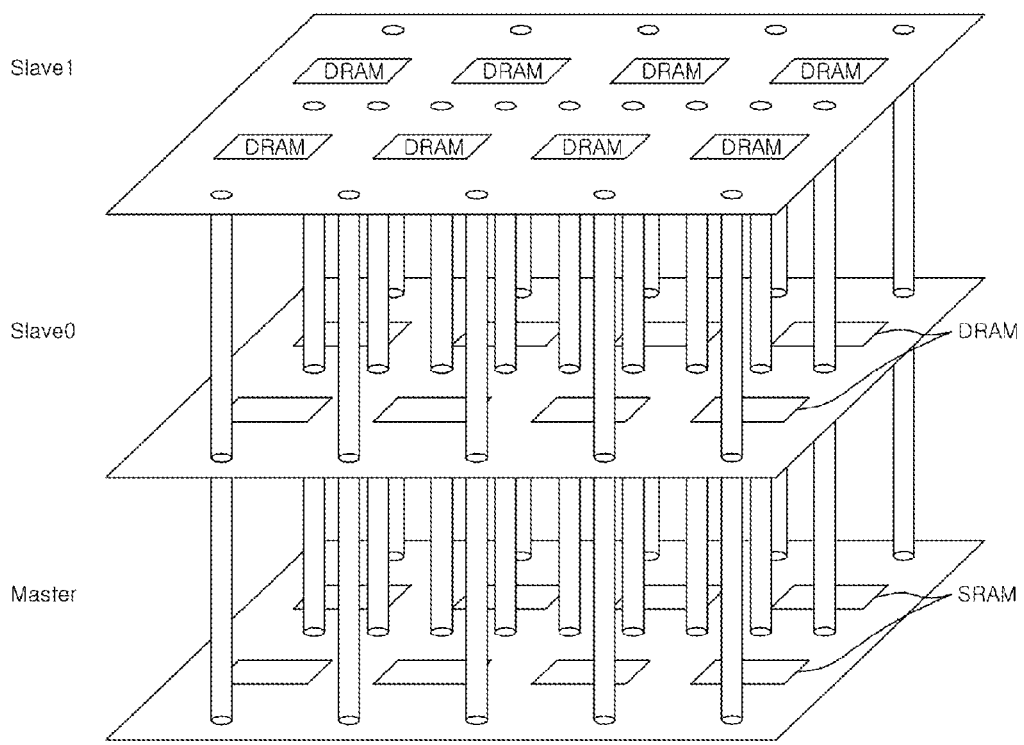
FIG. 5 is a perspective view of a semiconductor integrated circuit according to one exemplary embodiment.

FIG. 5 illustrates a semiconductor integrated circuit 100 with a structure in which a master and slaves 0 and 1 are stacked using a TSV.

According to one exemplary embodiment, the slaves 0 and 1 may comprise memory areas using dynamic random access memories (DRAMs), respectively, and the master comprises memory areas using static random access memories (SRAMs).

Each DRAM of the slaves 0 and 1 includes only normal cells and each SRAM of the master includes redundant cells for repairing the normal cells.

When viewed from the stack structure, the memory areas of the master are formed at positions corresponding to (i.e., opposite to) the memory areas of the slaves.

The memory areas are formed in the master as described above allowing the chip sizes of the master and the slave to be substantially equal to each other.

Figure 6:
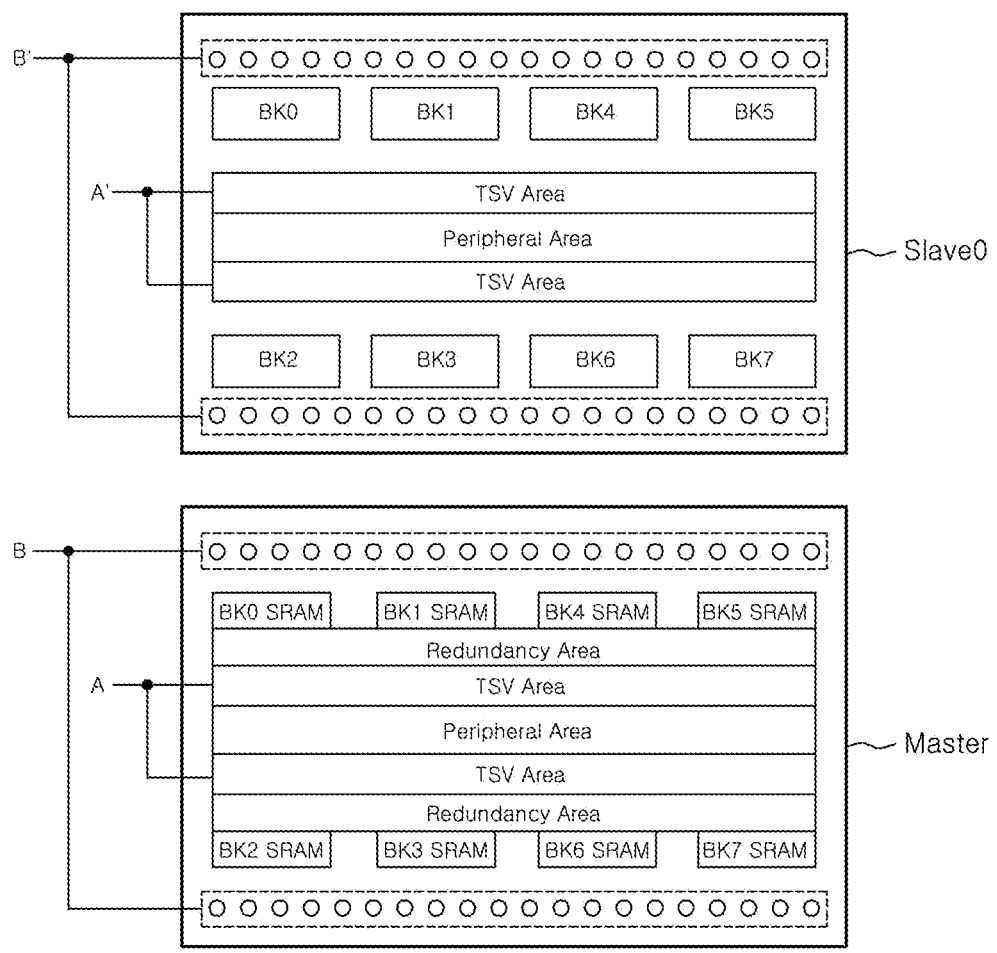
FIG. 6 is a layout diagram of a semiconductor integrated circuit according to one exemplary embodiment.

As illustrated in FIG. 6, in one exemplary embodiment, the slaves 0 and 1 may have the same configuration.

The slave 0 may comprise a peripheral area, a TSV area A' for signal transfer, a TSV area B' for physical support and supply of power, and memory areas.

The memory areas of the slave 0 may be divided into memory banks BK0 to BK7 using DRAMs, respectively.

As compared to the typical semiconductor integrated circuit 1 illustrated in FIG. 1, the slave 0 may comprise the memory banks BK0 to BK7 comprising only normal cells. A fuse set, a control logic circuit, and the like, which are related to a repair operation, are not formed. Although not illustrated, the memory banks BK0 to BK7 include a normal main word line and a normal sub-word line.

Meanwhile, the master may comprise a peripheral area, a TSV area A for signal transfer, a TSV area B for physical support and supply of power, a redundancy area, and memory areas.

The redundancy area may comprise a redundancy block having a fuse set, a control logic circuit, and the like, which are related to a repair operation. The memory areas of the master may be divided into memory banks BK0 SRAM to BK7 SRAM using SRAMs, respectively.

Although not illustrated, the memory banks BK0 SRAM to BK7 SRAM include a redundant main word line and a redundant sub-word line.

Figure 7:
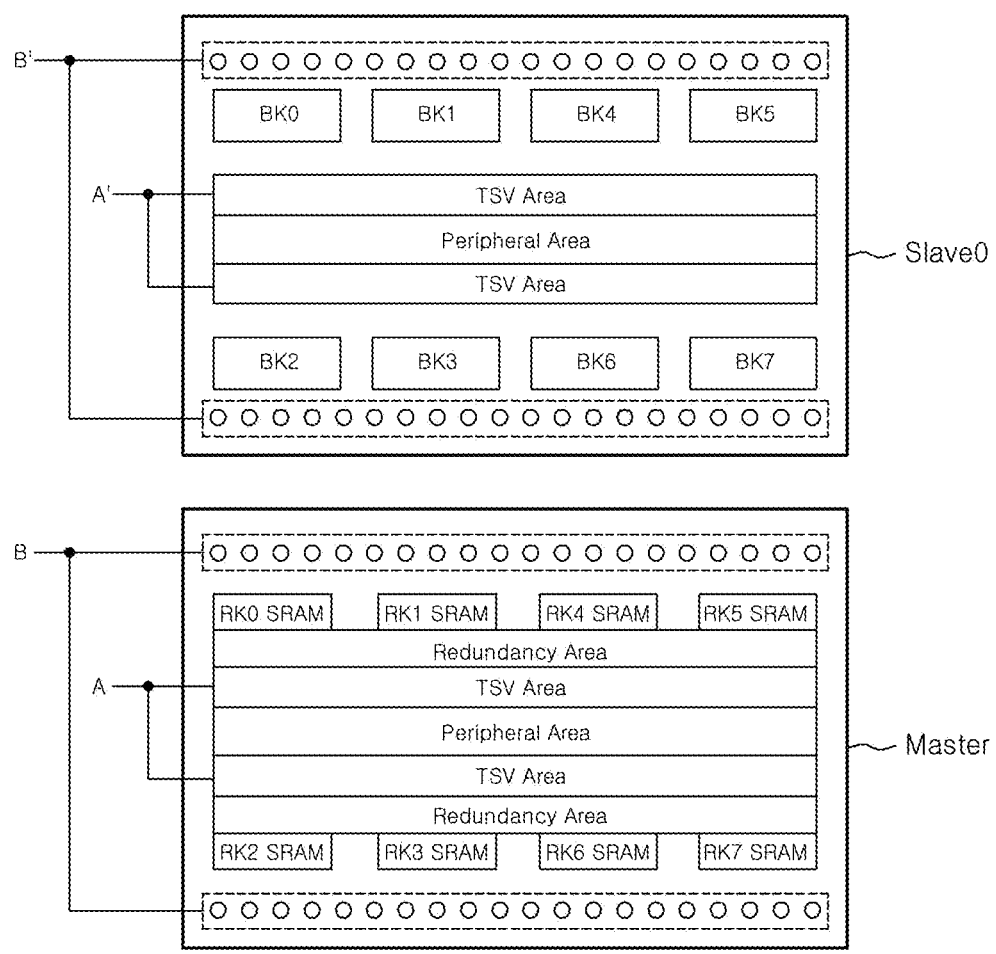
FIG. 7 is a layout diagram of a semiconductor integrated circuit according to another exemplary embodiment.

As illustrated in FIG. 7, in one exemplary embodiment, it is possible to provide a semiconductor integrated circuit 101 in which memory areas of the master are divided into ranks RK0 SRAM to RK7 SRAM in order to support a rank scheme.

The rank scheme is classified into a 8 rank, a 4 rank, a 2 rank, and a 1 rank.

In detail, a rank scheme in which the memory banks of all slaves are recognized as eight is referred to as the 8 rank, a rank scheme in which the memory banks of all slaves are recognized as four is referred to as the 4 rank, a rank scheme in which the memory banks of all slaves are recognized as two is referred to as the 2 rank, and a rank scheme in which the memory banks of all slaves are recognized as the same rank is referred to as the 1 rank.

Figure 8:
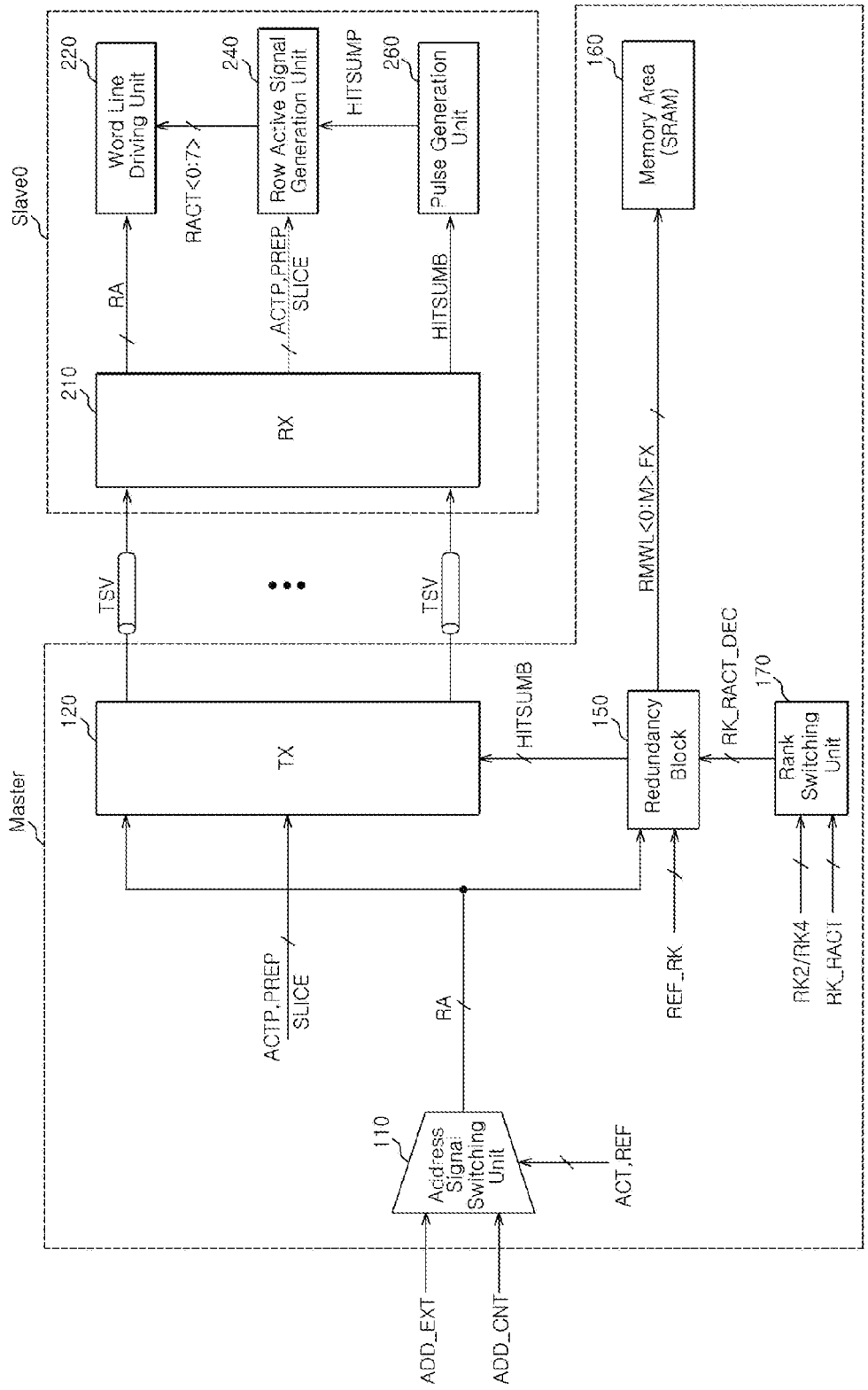
FIG. 8 is a block diagram of a master and a slave according to an exemplary embodiment.

FIG. 8 illustrates circuits related to the driving of word lines of the master and the slave 0.

As illustrated in FIG. 8, the master and the slave 0 are connected to each other through a plurality of TSVs.

As illustrated in FIG. 8, the master may comprise an address signal switching unit 110, a transmission unit (TX) 120, a redundancy block 150, a memory area 160, and a rank switching unit 170.

The address signal switching unit 110 is configured to output an external address signal ADD_EXT or a count address signal ADD_CNT as a row address signal RA in response to an active signal ACT and a refresh signal REF.

The active signal ACT is generated according to an active command regardless of banks/ranks.

The refresh signal REF is generated according to a refresh command regardless of banks/ranks.

The count address signal ADD_CNT is generated for a refresh operation in a refresh counter (not illustrated) in the semiconductor integrated circuit 100.

When the active signal ACT is input, the address signal switching unit 110 outputs the external address signal ADD_EXT as the row address signal RA.

When refresh signal REF is input, the address signal switching unit 110 outputs the count address signal ADD_CNT as the row address signal RA.

The transmission unit 120 is configured to transmit the row address signal RA, an active pulse ACTP, a precharge pulse PREP, a slice address signal SLICE, and a repair flag HITSUMB to the slave 0.

The slice address signal SLICE is used to distinguish a plurality of slaves from one another. In one exemplary embodiment, to based on FIG. 5, the slice address signal SLICE is used to distinguish the slave 0 from the slave 1.

The active pulse ACTP is provided according to memory banks to designate the activation of a corresponding memory bank.

The memory area 160 may use SRAMs, and may be divided into memory banks BK0 SRAM to BK7 SRAM as illustrated in FIG. 6 or ranks RK0 SRAM to RK7 SRAM as illustrated in FIG. 7.

Since the memory area 160 uses SRAMs, no refresh is required.

The rank switching unit 170 is configured to generate a signal for allowing the redundancy block 150 to select a redundant main word line according to a rank scheme (for example, the 8 rank, the 4 rank, the 2 rank, and the 1 rank).

The rank switching unit 170 is configured to decode a rank row active signal RK_RACT according to a rank scheme defined by rank signals RK2 and RK4 and generate a decoding signal RK_RACT_DEC.

The rank switching unit 170 may be prepared in the form of a decoder that performs a decoding operation according to a set allocation scheme, which will be described with reference to FIG. 13.

The redundancy block 150 is configured to activate redundant main word lines RMWL<0:M> and a sub-word line FX in response to the row address signal RA, a rank refresh signal REF_RK, and the decoding signal RK_RACT_DEC, and generate the repair flag HITSUMB.

The repair flag HITSUMB is a signal for informing slaves that the row address signal RA coincides with the repair address signal and a repair operation is performed.

As illustrated in FIG. 8, the slave 0 may comprise a reception unit (RX) 210, a word line driving unit 220, a row active signal generation unit 240, and a pulse generation unit 260.

The reception unit 210 is configured to receive the row address signal RA, the active pulse ACTP, the precharge pulse PREP, the slice address signal SLICE, and the repair flag HITSUMB, which are transmitted from the master.

The word line driving unit 220 is configured to activate the normal main word lines which correspond to the row address signal RA and row active signals RACT<0:7>, among the normal main word lines of the memory areas BK0 to BK7 (refer to FIG. 6).

The pulse generation unit 260 is configured to generate a repair flag pulse HITSUMP in response to the repair flag HITSUMB.

The row active signal generation unit 240 is configured to generate the row active signals RACT<0:7> in response to the active pulse ACTP, the precharge pulse PREP, the slice address signal SLICE, and the repair flag pulse HITSUMP.

Figure 9:
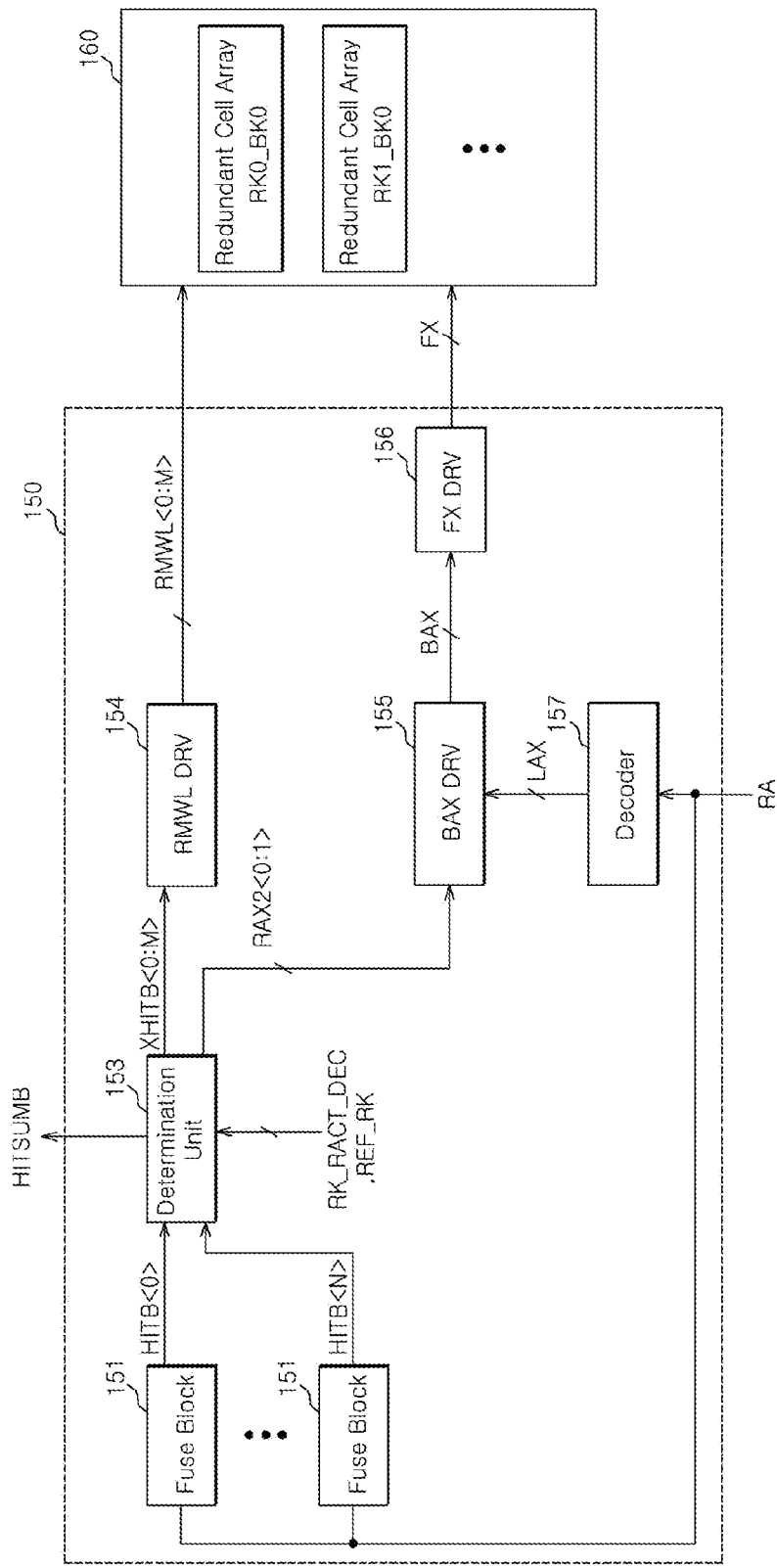
FIG. 9 is a block diagram of the redundancy block illustrated in FIG. 8.

As illustrated in FIG. 9, the redundancy block 150 may comprise a plurality of fuse blocks 151, a determination unit 153, a first driver block (RMWL DRV) 154, a second driver block (BAX DRV) 155, a third driver block 156 (FX DRV), and a decoder 157.

The plurality of fuse blocks 151 are configured to compare the row address signal RA with repair address signals stored therein respectively, and generate comparison signals HITB<0:N>.

The repair address signals are stored by selectively cutting fuses of the fuse blocks.

The determination unit 153 is configured to generate repair determination signals XHITB<0:M> and address signals RAX2<0:1> in response to the comparison signals HITB<0:N>, the decoding signal RK_RACT_DEC, and the rank refresh signal REF_RK.

The repair determination signals XHITB<0:M> are used to define a redundant main word line to be activated among the redundant main word lines RMWL<0:M>. The address signals RAX2<0:1> are used to select sub-word lines and correspond to an example in which main word lines and sub-word lines have been coded at the rate of 1:8.

The decoder 157 is configured to decode the row address signal RA and generate an address signal LAX.

The address signal LAX is used to replace a word line adjacent to a failed word line with a redundant main word line.

In a case in which when one word line fails, and only the failed word line is replaced with a redundant main word line, the address signal LAX is not necessary, and thus the decoder 157 is also not necessary.

The first driver block 154 is configured to drive the redundant main word lines RMWL<0:M> corresponding to the repair determination signals XHITB<0:M>.

The second driver block 155 is configured to drive the address signals RAX2<0:1> or the address signals RAX2<0:1> and LAX and generate an address signal BAX.

The third driver block 156 is configured to drive the address signal BAX and generate a sub-word line driving signal FX.

The memory area 160 includes redundant cell arrays RK0_BK0, RK1_BK0, . . . . The memory area 160 corresponds to an example in which the redundant cell arrays are allocated corresponding to banks and ranks.

Figure 10:
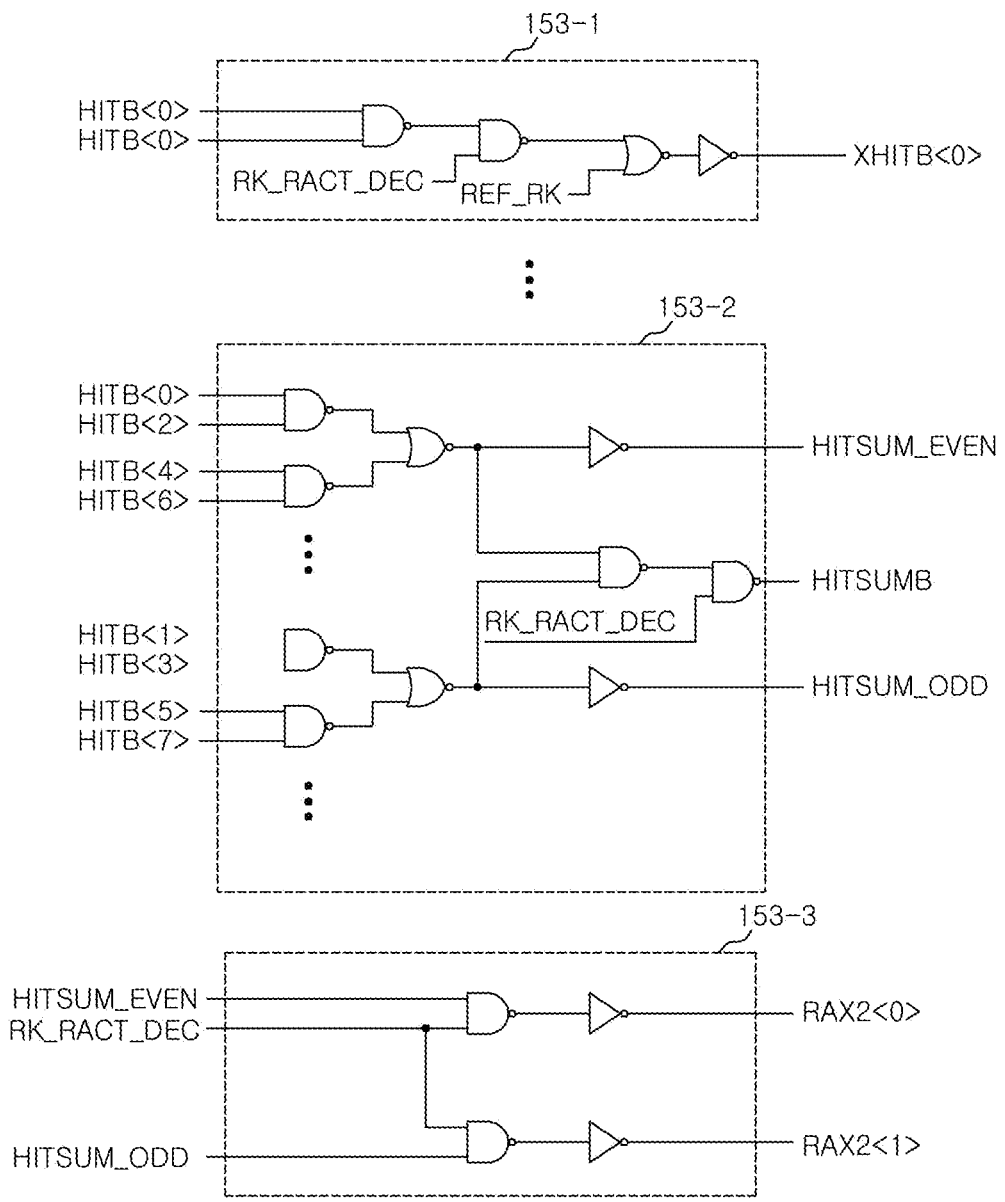
FIG. 10 is a circuit diagram of the determination unit illustrated in FIG. 9.

As illustrated in FIG. 10, the determination unit 153 includes logic circuits 153-1 to 153-3.

The logic circuit 153-1 is configured to combine the output signals HITB<0:N> of the fuse blocks 151, the decoding signal RK_RACT_DEC, and the rank refresh signal REF_RK, and generate the repair determination signals XHITB<0:M>.

FIG. 10 only illustrates a configuration in which the logic circuit 153-1 generates the signal XHITB<0>. An M+1 number of logic circuits 153-1 are provided in order to generate the repair determination signals XHITB<0:M>.

When any one of the output signals HITB<0:N> is activated and the decoding signal RK_RACT_DEC is also activated, the logic circuit 153-1 activates the signal XHITB<0>.

When the rank refresh signal REF_RK is activated, the logic circuit 153-1 deactivates the signal XHITB<0> regardless of the activation of other input signals.

The logic circuit 153-2 is configured to combine signals in even sequences with signals in odd sequences among the output signals HITB<0:N> of the fuse blocks 151, and generate signals HITSUM_EVEN and HITSUM_ODD.

When any one of the signals HITSUM_EVEN and HITSUM_ODD is activated and the decoding signal RK_RACT_DEC is also activated, the logic circuit 153-2 activates the repair flag HITSUMB.

The logic circuit 153-3 combines the signals HITSUM_EVEN, HITSUM_ODD and RK_RACT_DEC to generate the address signals RAX2<0:1>.

Figure 11:
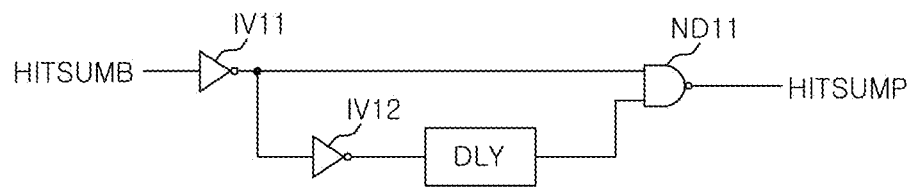
FIG. 11 is a circuit diagram of the pulse generation unit illustrated in FIG. 8.

As illustrated in FIG. 11, the pulse generation unit 260 may comprise a plurality of inverters IV11 and IV12, a delay DLY, and a NAND gate ND11.

The pulse generation unit 260 is configured to detect an activation timing (a falling edge) of the repair flag HITSUMB and generate the repair flag pulse HITSUMP with a width corresponding to the delay time of the delay DLY.

Figure 12:
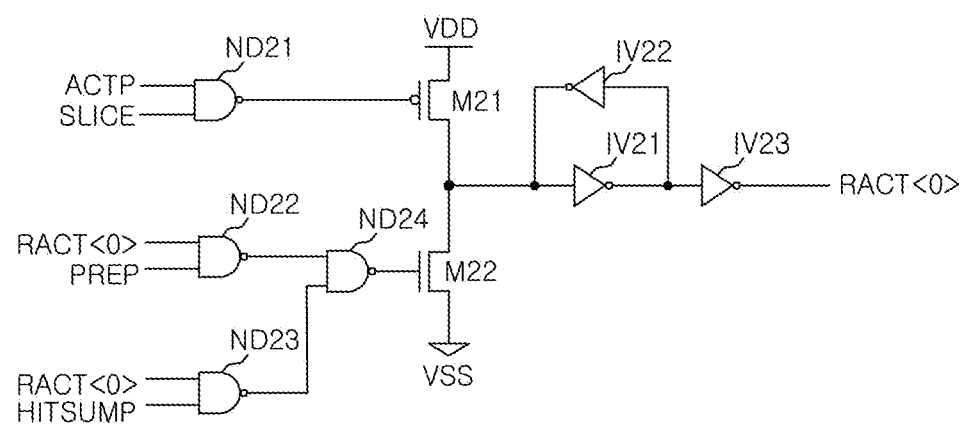
FIG. 12 is a circuit diagram of the row active signal generation unit illustrated in FIG. 8.

As illustrated in FIG. 12, the row active signal generation unit 240 may comprise a plurality of NAND gates ND21 to ND24, a plurality of transistors M21 and M22, and a plurality of inverters IV21 to IV23.

FIG. 12 only illustrates a configuration in which the row active signal generation unit 240 generates the row active signal RACT<0>. Eight circuits as those illustrated in FIG. 12 are provided in order to generate the row active signals RACT<0:7>.

The row active signal generation unit 240 is configured to activate the row active signal RACT<0> in response to the active pulse ACTP and the slice address signal SLICE are activated.

The row active signal generation unit 240 deactivates the row active signal RACT<0> when the precharge pulse PREP is generated in the state in which the row active signal RACT<0> has been activated.

The row active signal generation unit 240 deactivates the row active signal RACT<0> when the repair flag pulse HITSUMP is generated in the state in which the row active signal RACT<0> has been activated.

Figure 13:
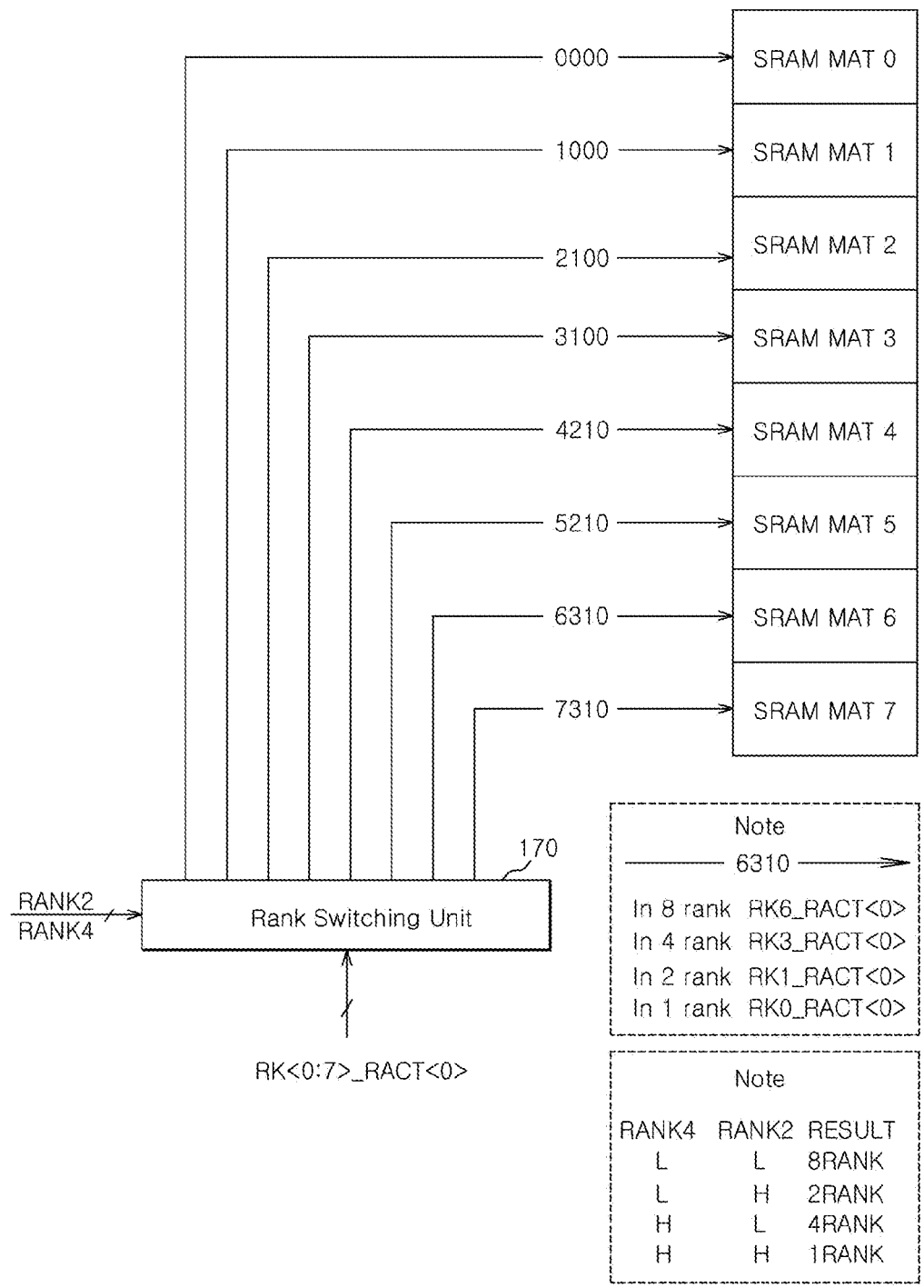
FIG. 13 is a block diagram explaining the operation of the rank switching unit illustrated in FIG. 8.

FIG. 13 illustrates a method for allocating rank row active signals RK<0:7>_RACT<0> to cell mats of the memory area 160 of the master in order to support all rank schemes (the 8 rank, the 4 rank, the 2 rank, and the 1 rank).

The rank row active signals RK<0:7>_RACT<0> support the 8 rank and indicate rank row active signals related to bank 0.

Rank signals RK2/RK4 are used to define the rank schemes. As illustrated in FIG. 13, the logic levels of the rank signals RK2/RK4 are combined, so that it is possible to define the 8 rank, the 4 rank, the 2 rank, and the 1 rank.

The rank schemes can be set by changing the logic levels of the rank signals RK2/RK4 using a fuse set, a test mode, and the like.

The rank row active signals RK<0:7>_RACT<0> are allocated to the cell mats (SRAM MAT 0 to SRAM MAT 7) according to the rank schemes (the 8 rank, the 4 rank, the 2 rank, and the 1 rank).

At this time, a rule for allocating the rank row active signals RK<0:7>_RACT<0> according to the rank schemes (the 8 rank, the 4 rank, the 2 rank, and the 1 rank) is established.

According to the rule, '0000' is designated to the SRAM MAT 0, '1000' is designated to the SRAM MAT 1, '2100' is designated to the SRAM MAT 2, '3100' is designated to the SRAM MAT 3, '4210' is designated to the SRAM MAT 4, '5210' is designated to the SRAM MAT 5, '6310' is designated to the SRAM MAT 6, and '7310' is designated to the SRAM MAT 7.

For example, the RK<6>_RACT<0> is allocated to the SRAM MAT 6 with the designated '6310' in a case of the 8 rank, the RK<3>_RACT<0> is allocated thereto in a case of the 4 rank, the RK<1>_RACT<0> is allocated thereto in a case of the 2 rank, and the RK<0>_RACT<0> is allocated thereto in a case of the 1 rank.

Thus, the rank switching unit 170 provides the cell mats (SRAM MAT 0 to SRAM MAT 7) with the rank row active signals RK<0:7>_RACT<0> in response to the rank signals RK2/RK4.

For example, when the rank signals RK2/RK4 define the 8 rank and the rank row active signal RK<7>_RACT<0> has been activated, the rank switching unit 170 provides the SRAM MAT 7 with the rank row active signal RK<7>_RACT<0>.

When the rank signals RK2/RK4 define the 4 rank and the rank row active signal RK<3>_RACT<0> has been activated, the rank switching unit 170 provides the cell mats SRAM MAT 6 and the SRAM MAT 7 with the rank row active signal RK<3>_RACT<0>.

When the rank signals RK2/RK4 define the 2 rank and the rank row active signal RK<1>_RACT<0> has been activated, the rank switching unit 170 provides the cell mats SRAM MAT 4 to the SRAM MAT 7 with the rank row active signal RK<1>_RACT<0>.

When the rank signals RK2/RK4 define the 1 rank and the rank row active signal RK<0>_RACT<0> has been activated, the rank switching unit 170 provides all the cell mats SRAM MAT 0 to the SRAM MAT 7 with the rank row active signal RK<0>_RACT<0>.

The rank switching unit 170 may be provided in the form of a decoder that performs a decoding operation according to the allocation scheme of the rank row active signals as described with reference to FIG. 13.

FIGS. 14 to 17 illustrate an example in which the redundant cells of the memory area 160 are configured according to the allocation scheme of the rank row active signals RK<0:7>_RACT<0:7> as described with reference to FIG. 13.

In one embodiment, the memory area 160 is divided into memory banks and each memory bank is divided into ranks.

In the case of a 8 rank and a 8 bank, as illustrated in FIG. 14, the rank row active signals RK<0:7>_RACT<0:7> are allocated to cell mats. That is, eight rank row active signals RK<0:7>_RACT<0:7> are allocated to the cell mats, respectively.

In the case of a 4 rank and a 8 bank, as illustrated in FIG. 15, the rank row active signals RK<0:3>_RACT<0:7> are allocated to the cell mats. That is, four sets of rank row active signals RK<0:3>_RACT<0:7> are allocated to the cell mats, respectively. Thus, twice as many redundant main word lines as those of the 8 rank are allocated in the case of the 4 rank.

In the case of a 2 rank and a 8 bank, as illustrated in FIG. 16, the rank row active signals RK<0:1>_RACT<0:7> are allocated to the cell mats. That is, two sets of rank row active signals RK<0:1>_RACT<0:7> are allocated to the cell mats, respectively. Thus, twice as many redundant main word lines as those of the 4 rank are allocated in the case of the 2 rank.

In the case of a 1 rank and a 8 bank, as illustrated in FIG. 17, the rank row active signals RK<0>_RACT<0:7> are allocated to the cell mats. That is, one set of eight rank row active signals RK<0>_RACT<0:7> are allocated to the cell mats, respectively. Thus, twice as many redundant main word lines as those of the 2 rank are allocated in the case of the 1 rank.

According to an exemplary embodiment, a redundancy area comprising a fuse set, a control logic circuit and the like, which are related to a repair operation, and a memory area including redundant cells are formed in a master, so that it is possible to solve an unbalance of circuit areas between the master and a slave. Consequently, it is possible to increase a net die by simultaneously increasing the efficiency of the circuit areas of the master and the slave.

Furthermore, an SRAM is used for the memory area of the master, so that no refresh is necessary and an operation time for redundancy can be minimized. Consequently, asynchronous parameters are reduced, so that the operation speed of a semiconductor integrated circuit can be improved.

While certain embodiments have been described above, it will be understood to those skilled in the art that the embodiments described are by way of example only. Accordingly, the semiconductor integrated circuit and the control method thereof described herein should not be limited based on the described embodiments. Rather, the semiconductor integrated circuit and the control method thereof described herein should only be limited in light of the claims that follow when taken in conjunction with the above description and accompanying drawings.

What is claimed is:

1. A semiconductor integrated circuit comprising:
    a first chip; and
    a second chip stacked together with the first chip,
        wherein a first memory area is formed on the second chip, and a second memory area for repairing a failure of the first memory area is formed on the first chip.

2. The semiconductor integrated circuit according to claim 1, wherein the first chip is a master chip and the second chip is a slave chip.

3. The semiconductor integrated circuit according to claim 1, wherein the first memory area comprises a memory type different from a memory type of the second memory area.

4. The semiconductor integrated circuit according to claim 1, wherein the first chip is connected to the second chip through a through-silicon via (TSV).

* * * * *